US012784624B2

(12) United States Patent
Chang et al.

(10) Patent No.: US 12,784,624 B2
(45) Date of Patent: Nov. 3, 2026

(54) DISPLAY DEVICE FOR EXAMINING THE STATUS OF A SOURCE LINE AND INTEGRATED CIRCUIT THEREOF

(71) Applicant: NOVATEK MICROELECTRONICS CORP., Hsinchu (TW)

(72) Inventors: Yao-Chung Chang, Taichung City (TW); Chih-Chang Lai, Taichung City (TW); Yi-Cheng Yuan, New Taipei City (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 19/096,977

(22) Filed: Apr. 1, 2025

(65) Prior Publication Data

US 2025/0308419 A1 Oct. 2, 2025

Related U.S. Application Data

(60) Provisional application No. 63/572,998, filed on Apr. 2, 2024.

(51) Int. Cl.

| | |
|---|---|
| ***G09G 3/00*** | (2006.01) |
| ***G01R 31/52*** | (2020.01) |
| ***G01R 31/54*** | (2020.01) |

(52) U.S. Cl.
CPC ............. *G09G 3/006* (2013.01); *G01R 31/52* (2020.01); *G01R 31/54* (2020.01); *G09G 2330/12* (2013.01)

(58) Field of Classification Search
CPC .... G09G 3/006; G09G 2330/12; G01R 31/54; G01R 31/52; G01R 35/00; G01R 31/58; G01R 31/00; G01R 31/26
See application file for complete search history.

(56) References Cited

U.S. PATENT DOCUMENTS

2019/0189058 A1* 6/2019 Cho .................... G09G 3/3258

FOREIGN PATENT DOCUMENTS

| | | | | |
|---|---|---|---|---|
| TW | I607673 B | * 12/2017 | .......... | G09G 3/3291 |
| TW | M627999 U | * 6/2022 | .......... | G09G 3/3225 |

* cited by examiner

*Primary Examiner* — Matthew A Eason
*Assistant Examiner* — Scott D Au
(74) *Attorney, Agent, or Firm* — Rosenberg, Klein & Lee

(57) ABSTRACT

The disclosure describes a display device for examining the short-circuit/open-circuit status of a source line of a display panel and an integrated circuit thereof. The integrated circuit includes analog front-end (AFE) circuits and multiplexer groups. Each AFE circuit includes a non-inverting input terminal coupled to a first predetermined voltage and an inverting input terminal. Each multiplexer group includes multiplexers. Each multiplexer includes a first terminal coupled to one source line of the display panel and second terminals given by different settings. The source line is configured correspondingly to one of the different settings by electrically connecting the first terminal and a selected second terminal. One of the second terminals is coupled to the inverting input terminal of one of the AFE circuits corresponding to one of the multiplexer groups.

36 Claims, 8 Drawing Sheets

DISPLAY DEVICE FOR EXAMINING THE STATUS OF A SOURCE LINE AND INTEGRATED CIRCUIT THEREOF

CROSS-REFERENCE TO RELATED APPLICATION(S)

This disclosure claims priority to and the benefit of U.S. Provisional Application No. 63/572,998, filed on 2 Apr. 2024, which is incorporated herein by reference for all purposes.

BACKGROUND OF THE INVENTION

Field of the Invention

The invention relates to display technology, particularly to a display device for examining the short-circuit/open-circuit status of a source line of a display panel and an integrated circuit thereof.

Description of the Related Art

In conventional technology for inspecting a display panel, the display functionality is tested at two primary stages, namely a cell test stage and an integrated circuit (IC) bonding stage. At the cell test stage, the display panel is tested before the integrated circuit (IC) bonding process.

At the cell test stage, driving signals are applied to source lines and gate lines through test pads on the glass substrate of the display panel to activate the display panel, accompanying with an external backlight module. Then, automatic optical inspection (AOI) is performed to identify and eliminate defective panels by displaying simple test patterns before the IC bonding process. The IC bonding process includes a film-on-glass (FOG)/chip-on-glass (COG) process and a module-assembling process. After the IC bonding process bonding a display driver IC, additional display tests are performed. The display driver IC is driven to display complex images and the current output of the display panel is tested through test pads, to detect display abnormalities. These inspection methods rely on external testing instruments or manual verification (e.g., optical inspection, visual inspection, and current measurement). However, after a display module is integrated into a system such as an automotive display and touch integrated system, a mobile phone, or a tablet computer, any subsequent display failures cannot be directly detected by the display driver IC. Currently, in automotive display devices, human-machine interfaces (HMIs) such as the instrument cluster, infotainment system, and warning indicators are combined into a single display module. If this display module malfunctions, the driver and passengers may be not able to access critical information in real-time, posing a potential safety risk.

SUMMARY OF THE INVENTION

The invention provides a display device for examining the status of a source line of a display panel and an integrated circuit thereof, which determine whether the display panel is abnormal and is able to warn the user to reduce emergencies and increase safety.

In an embodiment of the invention, an integrated circuit that is applicable to inspecting a display panel includes a plurality of analog front-end (AFE) circuits and a plurality of multiplexer groups. Each AFE circuit includes a non-inverting input terminal coupled to a first predetermined voltage and an inverting input terminal. Each multiplexer group includes a plurality of multiplexers. Each multiplexer is correspondingly configured in relation to one source line of the display panel. Each multiplexer includes a first terminal coupled to the source line of the display panel and a plurality of second terminals given by different settings. The source line is configured correspondingly to one of the different settings by electrically connecting the first terminal and a selected second terminal from the second terminals. One of the second terminals is alternatively coupled to the inverting input terminal of one of the AFE circuits corresponding to one of the multiplexer groups.

In an embodiment of the invention, a display device includes an integrated circuit and a display panel, wherein the display panel includes source lines, gate lines, a testing wire, and a plurality of testing switches. The integrated circuit includes a plurality of analog front-end (AFE) circuits and a plurality of multiplexer groups. Each source line includes one end near the integrated circuit and the other end far from the integrated circuit. An inspected source line among the source lines is controlled to be electrically connected or disconnected to a first AFE circuit among the AFE circuits by a first multiplexer of a first multiplexer group of the multiplexer groups. The testing wire is provided with a second predetermined voltage to the inspected source line. Each testing switch is coupled between the testing wire and the other end of one of the source lines far from the integrated circuit and configured to perform at least one of the following actions:

- electrically connect the testing wire and the inspected source line when the first AFE circuit examines whether the inspected source line is open-circuit; and
- electrically disconnect the testing wire and the inspected source line when the first AFE circuit examines whether the inspected source line is short-circuited to another source line; and
- electrically disconnect the testing wire and the inspected source line when the first AFE circuit examines whether the inspected source line is short-circuited to a gate line.

To sum up, the display device and the integrated circuit use the AFE circuits to determine whether the display panel is abnormal and is able to warn the user, thereby reducing emergencies and increasing safety.

Below, the embodiments are described in detail in cooperation with the drawings to make easily understood the technical contents, characteristics and accomplishments of the invention.

DETAILED DESCRIPTION OF THE INVENTION

Figure 1:
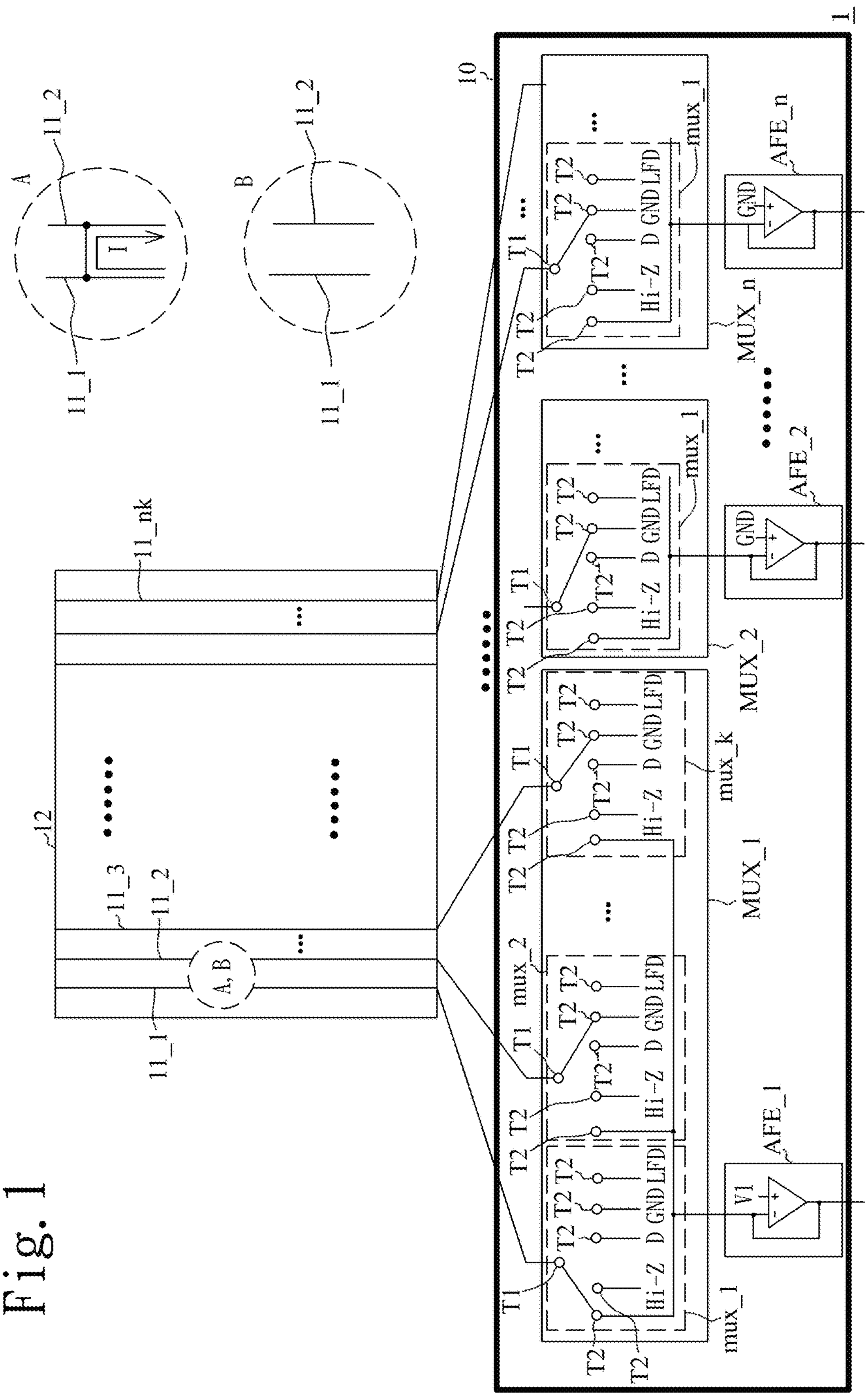
FIG. 1 is a diagram schematically illustrating a display device according to a first embodiment of the invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

In the following description, a display device for examining the status of a source line of a display panel and an integrated circuit thereof will be described. The integrated circuit uses analog front-end (AFE) circuits to determine whether the display panel is abnormal and is able to warn the user, thereby reducing emergencies and increasing safety. The integrated circuits described below may also be applied to other circuit configurations.

FIG. 1 is a diagram schematically illustrating a display device according to a first embodiment of the invention. Referring to FIG. 1, the first embodiment of a display device 1 is introduced as follows. The display device 1 includes an integrated circuit (IC) 10 and a display panel 12 including source lines 11_1~**11_*k*. The source lines 11_1~11_*k* are arranged on a pixel substrate, where k is a positive integer greater than 1. The IC 10 is applicable to inspecting the display panel 12. The integrated circuit 10 includes a plurality of analog front-end (AFE) circuits AFE_1~AFE_n and a plurality of multiplexer groups MUX_1~MUX_n. n is a positive integer greater than 1. The AFE circuits AFE_1~AFE_n may be, but not limited to, touch sensing AFE circuits. Each of the AFE circuits AFE_1~AFE_n includes a non-inverting input terminal coupled to a first predetermined voltage V1 and an inverting input terminal. In some embodiments of the invention, the AFE circuits AFE_1~AFE_n may be, but not limited to, operational amplifiers. The output terminal and the non-inverting input terminal of the operational amplifier are coupled to each other. Each of the multiplexer groups MUX_1~MUX_n includes a plurality of multiplexers mux_1~mux_k. Each of the multiplexers mux_1~mux_k is correspondingly configured in relation to one of the k source lines, such as one of the source lines 11_1~11_*k*, one of the source lines 11_(*k*+1)~11_(2*k*), . . . , one of the source lines 11_((*n*−1)*k*+1)~11_*nk*. Each of the multiplexers mux_1~mux_k includes a first terminal T1 coupled to one of the k source lines and a plurality of second terminals T2 given by different settings. The different settings include, but are not limited to, a first predetermined voltage V1, a high impedance state Hi-Z, output display data D, a ground voltage GND, and a load free driving signal LFD. It is noted that the first predetermined voltage V1 is provided to one of the second terminals by connecting the second terminal to an inverting input terminal of an AFE circuit whose non-inverting input terminal is provided with the first predetermined voltage V1. One of the k source lines, such as 11_1~11_*k* is configured correspondingly to one of the different settings by electrically connecting the first terminal T1 and the selected second terminal T2. As an example shown in FIG. 1, one of the second terminals T2 is coupled to the inverting input terminal of the AFE circuit AFE_1 corresponding to the multiplexer group MUX_1, wherein the non-inverting input terminal of the AFE circuit AFE_1 is provided with the first predetermined voltage V1**.

For illustrative purposes, take the multiplexer mux_1 as a first multiplexer, the multiplexer group MUX_1 as a first multiplexer group, and the AFE circuit AFE_1 as a first AFE circuit. When one end of the inspected source line 11_1 of the display panel 12 near the integrated circuit 10 coupled to the first multiplexer of the first multiplexer group among the multiplexer groups MUX_1~MUX_n is connected to the inverting input terminal of the first AFE circuit corresponding to the first multiplexer group and provided with the first predetermined voltage V1 and the other end of the inspected source line 11_1 far from the integrated circuit 10 is electrically floating, and the ends of the non-inspected source lines 11_2~11_*k* near the integrated circuit 10 which are connected to the multiplexers mux_2~mux_k other than the first multiplexer mux_1 of the first multiplexer group are provided with another voltage different from the first predetermined voltage V1 through the multiplexers mux_2~mux_k of the first multiplexer group, whether the inspected source line 11_1 is short-circuited to one of the non-inspected source lines 11_2~11_*k* is examined by the first AFE circuit. In the first embodiment, the non-inspected source lines 11_2~11_*k* are provided with a ground voltage GND different from the first predetermined voltage V1. In addition, the non-inverting input terminals of the AFE circuits AFE_2~AFE_n are coupled to the ground voltage GND. As illustrated in case A of FIG. 1, the first AFE circuit detects a current I so as to output a corresponding voltage due to a closed loop that is formed when the inspected source line 11_1 is short-circuited to one of the non-inspected source lines 11_2~11_*k*, usually the non-inspected source line nearest to the inspected source line. As illustrated in case B of FIG. 1, the first AFE circuit detects no current due to a closed loop that is not formed when the inspected source line 11_1 is not short-circuited to one of the non-inspected source lines 11_2~11_*k*. The AFE circuit AFE_1 can determine whether the display panel 12 is abnormal (i.e., source lines short-circuited) and thus the display device 1 using the display panel 12 and the IC 10 is able to warn the user of the display device 1 (e.g., automotive display devices) to reduce emergencies and increase safety.

Figure 2:
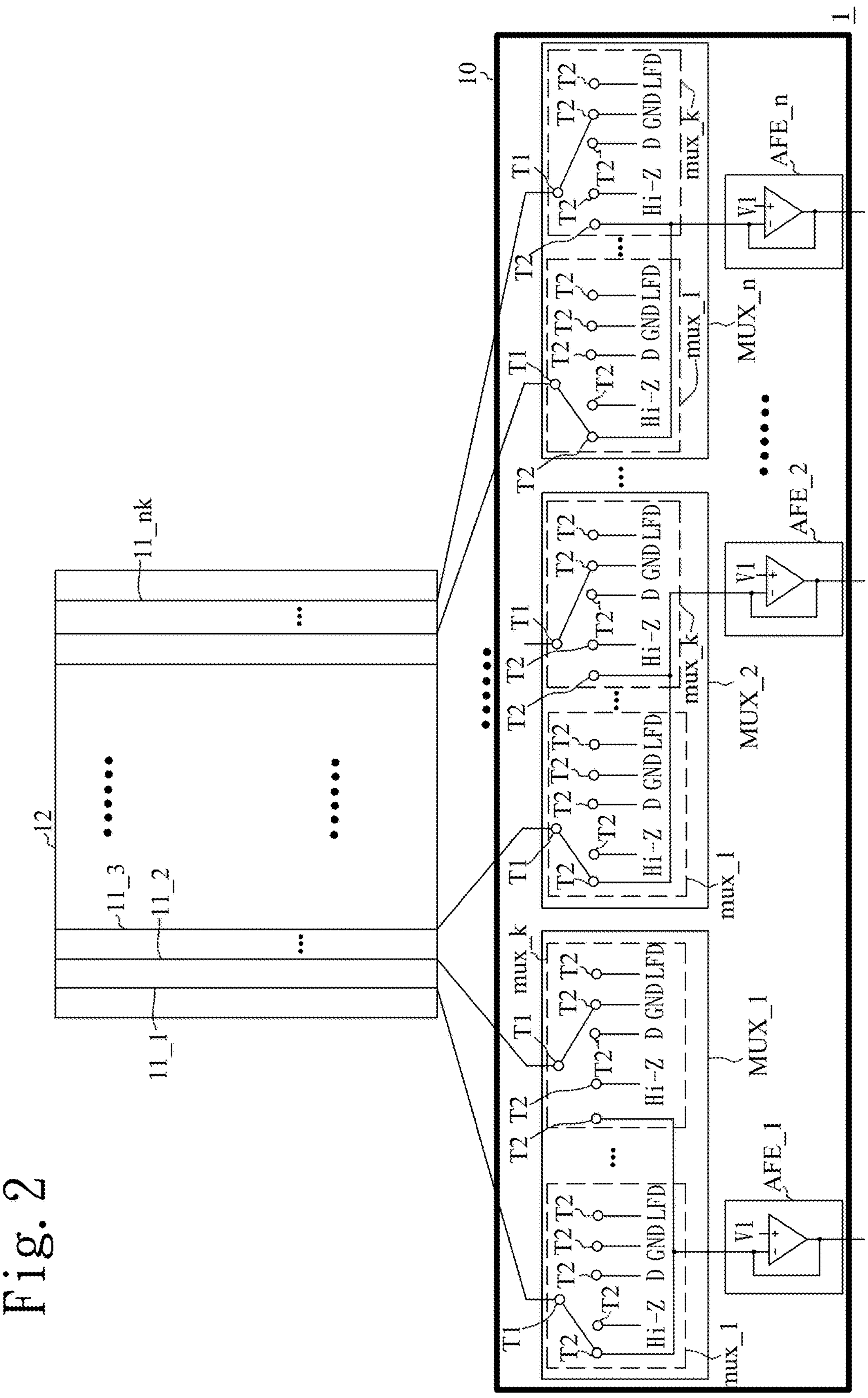
FIG. 2 is a diagram schematically illustrating a display device according to a second embodiment of the invention.

FIG. 2 is a diagram schematically illustrating a display device according to a second embodiment of the invention. Referring to FIG. 2, the second embodiment of the display panel 12 is introduced as follows. The circuit architecture of the second embodiment is the same as that of the first embodiment so it will not be reiterated.

For illustrative purposes, take the multiplexer mux_1 of each of the multiplexer groups MUX_1~MUX_n as a first multiplexer. When one end of each inspected source line of the display panel 12 near the integrated circuit 10 coupled to the first multiplexer of each of the multiplexer groups MUX_1~MUX_n is connected to the inverting input terminal of each AFE circuit AFE_1~AFE_n and provided with the first predetermined voltage V1 and the other end of each inspected source line far from the integrated circuit 10 is electrically floating, and the non-inspected source lines which are connected to other multiplexers mux_2~mux_k of each of the multiplexer groups MUX_1~MUX_n are provided with another voltage different from the first predetermined voltage V1, whether the inspected source lines are short-circuited to the non-inspected source lines is examined by the AFE circuits AFE_1~AFE_n at the same time. In the second embodiment, the non-inspected source lines are provided with a ground voltage GND different from the first predetermined voltage V1. In addition, the non-inverting input terminals of the AFE circuits AFE_1~AFE_n are coupled to the first predetermined voltage V1. Each of the AFE circuits AFE_1~AFE_n detects a current so as to output a corresponding voltage due to closed loops that are formed when the inspected source lines are short-circuited to the non-inspected source lines. Each of the AFE circuits AFE_1~AFE_n detects no current due to closed loops that are not formed when the inspected source lines are not short-circuited to the non-inspected source lines. The AFE circuits AFE_1~AFE_n can determine whether the display panel 12 is abnormal (i.e., source lines short-circuited) and thus the display device 1 using the display panel 12 and the IC 10 is able to warn the user to reduce emergencies and increase safety.

Figure 3:
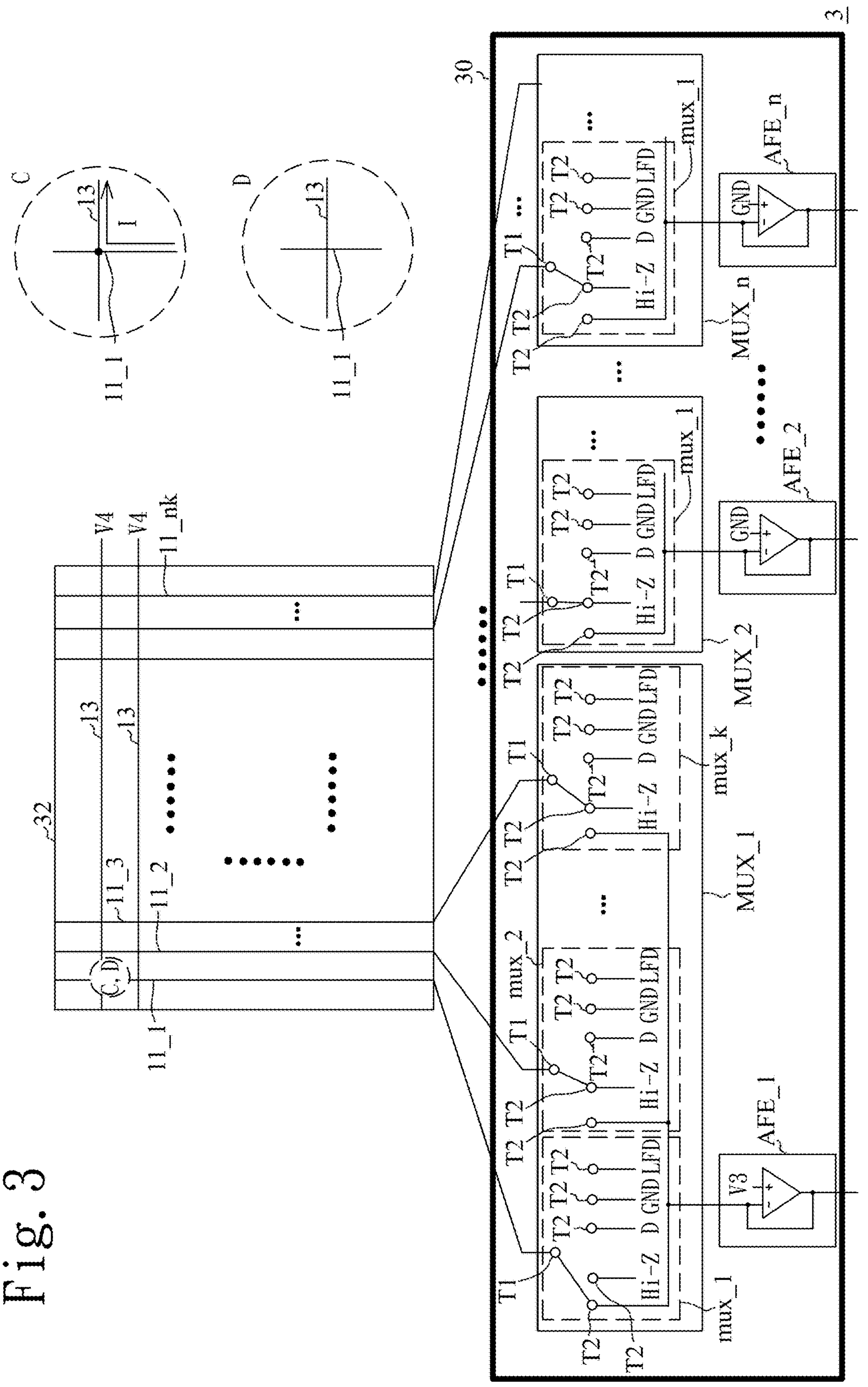
FIG. 3 is a diagram schematically illustrating a display device according to a third embodiment of the invention.

FIG. 3 is a diagram schematically illustrating a display device according to a third embodiment of the invention. Referring to FIG. 3, the third embodiment of a display device 3 is introduced as follows. The display device 3 includes a display panel 32 and an IC 30, and compared to the first embodiment, the display panel 32 of the third embodiment further includes gate lines 13 arranged on the pixel substrate. The other circuit architecture of the third embodiment is similar to that of the first embodiment so it will not be reiterated.

Assume that the multiplexer mux_1 is used as a first multiplexer, that the multiplexer group MUX_1 is used as a first multiplexer group, and that the AFE circuit AFE_1 is used as a first AFE circuit. When one end of the inspected source line 11_1 of the display panel 32 near the integrated circuit 30 coupled to the first multiplexer of the first multiplexer group among the multiplexer groups MUX_1~MUX_n is connected to the inverting input terminal of the first AFE circuit corresponding to the first multiplexer group and provided with a third predetermined voltage V3 and the other end of the inspected source line 11_1 far from the integrated circuit 30 is electrically floating, and the gate lines 13 of the display panel 32 are provided with another voltage, such as a fourth predetermined voltage V4 different from the third predetermined voltage V3, whether the inspected source line 11_1 is short-circuited to one of the gate lines 13 is examined by the first AFE circuit. During the source line 11_1 is being inspected, the non-inspected source lines 11_2~11_*k* which are connected to other multiplexers mux_2~mux_k of the first multiplexer group are kept in a high impedance state Hi-Z, and non-inspected source lines which are connected to all other multiplexers mux_1~mux_k of each of the multiplexer groups MUX_2~MUX_n are kept in a high impedance state Hi-Z. In addition, the non-inverting input terminals of the AFE circuits AFE_2~AFE_n are coupled to the ground voltage GND. As illustrated in case C of FIG. 3, the first AFE circuit detects a current I so as to output a corresponding voltage due to a closed loop that is formed when the inspected source line 11_1 is short-circuited to one of the gate lines 13. As illustrated in case D of FIG. 3, the first AFE circuit detects no current due to a closed loop that is not formed when the inspected source line 11_1 is not short-circuited to one of the gate lines 13. The AFE circuit AFE_1 can determine whether the display panel 32 is abnormal (i.e., source line and gate line short-circuited) and thus the display device 3 using the display panel 32 and the IC 30 is able to warn the user to reduce emergencies and increase safety.

Figure 4:
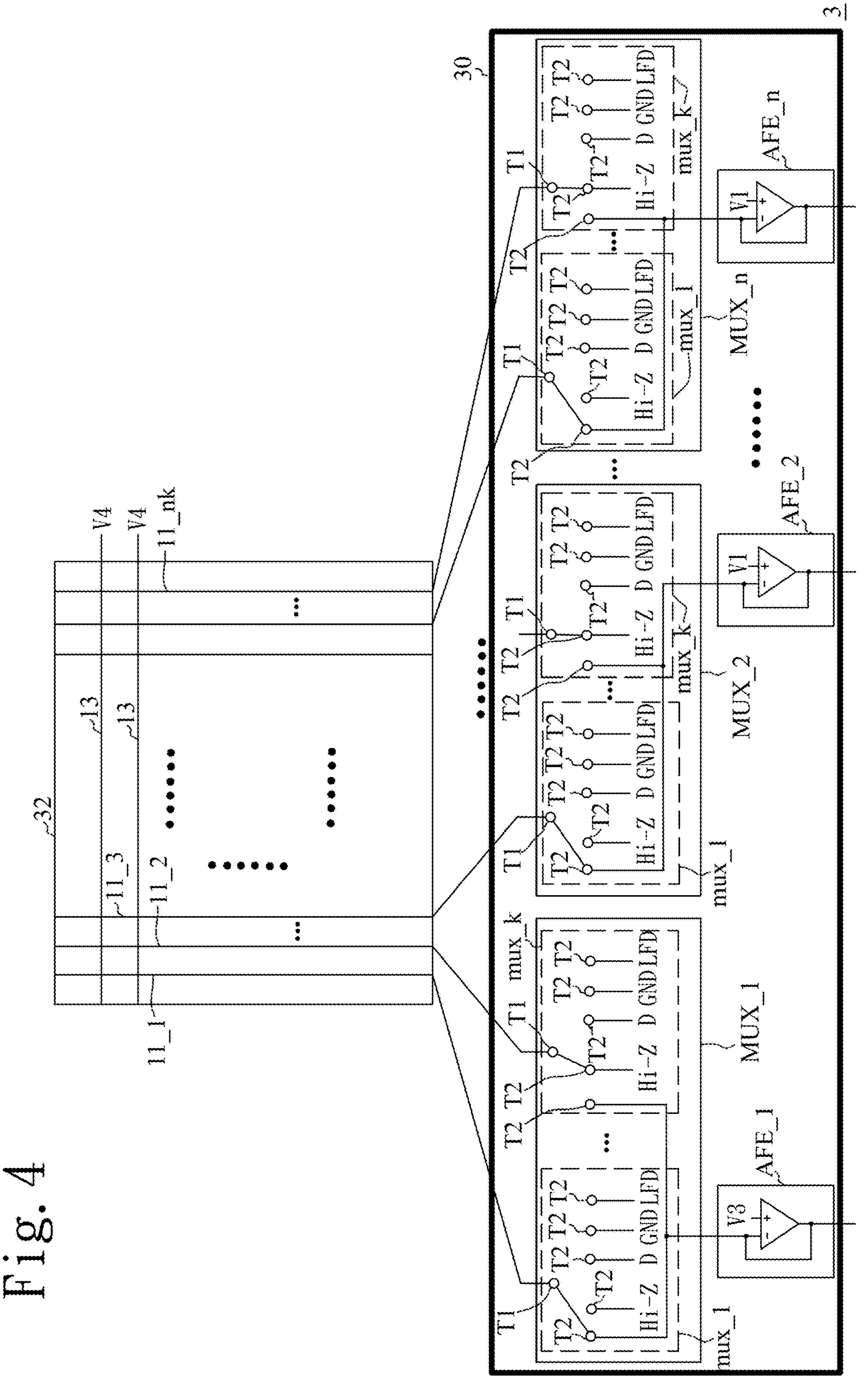
FIG. 4 is a diagram schematically illustrating a display device according to a fourth embodiment of the invention.

FIG. 4 is a diagram schematically illustrating a display device according to a fourth embodiment of the invention. Referring to FIG. 4, the fourth embodiment of the display device 3 is introduced as follows. The circuit architecture of the fourth embodiment is the same as that of the third embodiment so it will not be reiterated.

For illustrative purposes, take the multiplexer mux_1 of each of the multiplexer groups MUX_1~MUX_n as a first multiplexer. When one end of each inspected source line of the display panel 32 near the integrated circuit 30 coupled to the first multiplexer of each of the multiplexer groups MUX_1~MUX_n is connected to the inverting input terminal of each AFE circuit AFE_1~AFE_n and provided with the third predetermined voltage V3 and the other end of each inspected source line far from the integrated circuit 30 is electrically floating, and the gate lines 13 of the display panel 32 are provided with the fourth predetermined voltage V4 different from the third predetermined voltage V3, whether the inspected source lines are short-circuited to the gate lines 13 is examined by the AFE circuits AFE_1~AFE_n at the same time. Each of the AFE circuits AFE_1~AFE_n detects a current so as to output a corresponding voltage due to closed loops that are formed when the inspected source lines are short-circuited to the gate lines 13. Each of the AFE circuits AFE_1~AFE_n detects no current due to closed loops that are not formed when the inspected source lines are not short-circuited to the gate lines 13. In this example, during one source line with respect to a multiplexer of a multiplexer group is inspected, other non-inspected source lines which are connected to other multiplexers of the multiplexer group are kept in a high impedance state Hi-Z. The AFE circuits AFE_1~AFE_n can determine whether the display panel 32 is abnormal (i.e., source line and gate line short-circuited) and thus the display device 3 using the display panel 32 and the IC 30 is able to warn the user to reduce emergencies and increase safety.

Figure 5:
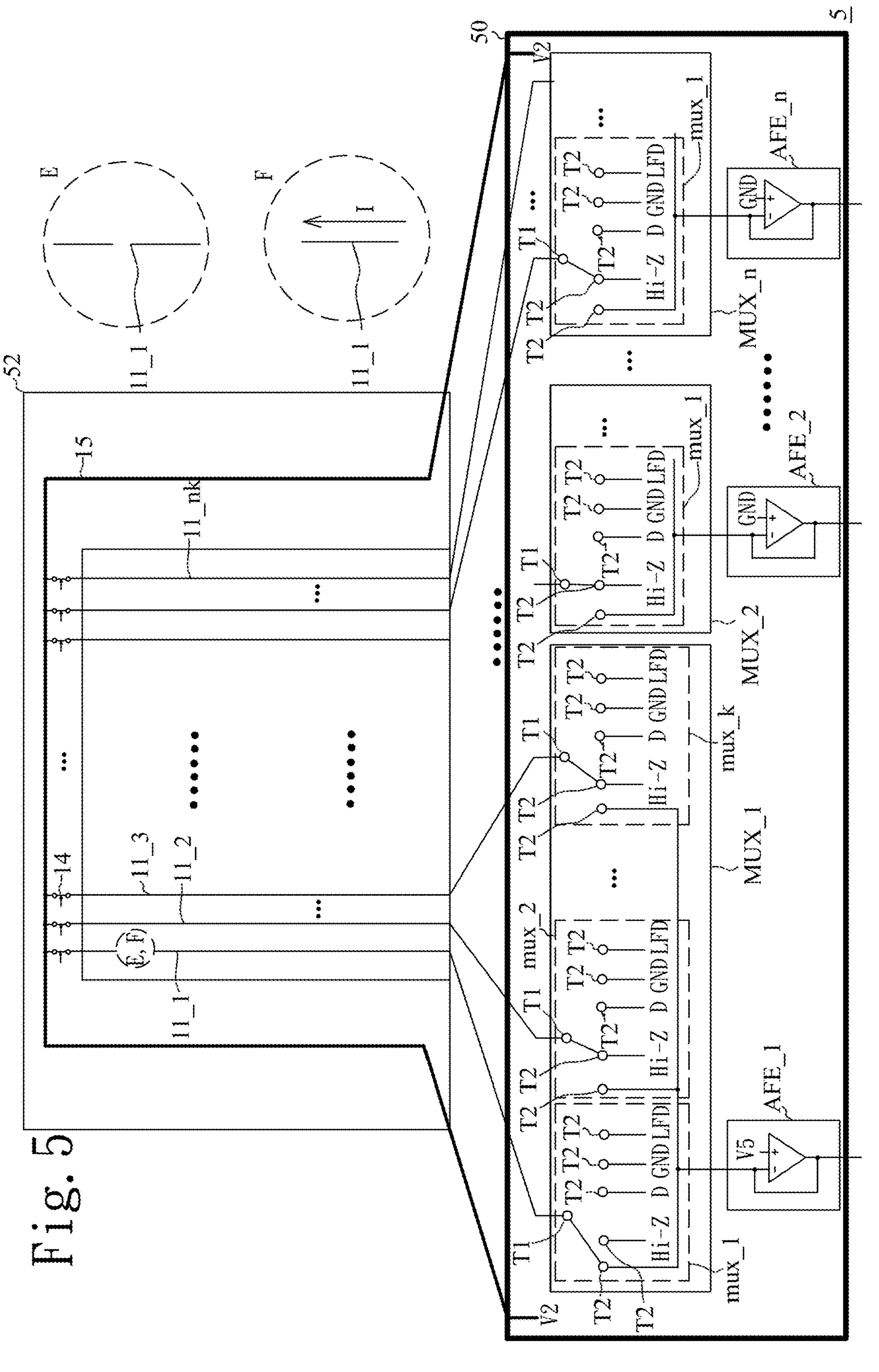
FIG. 5 is a diagram schematically illustrating a display device according to a fifth embodiment of the invention.

FIG. 5 is a diagram schematically illustrating a display device according to a fifth embodiment of the invention. Referring to FIG. 5, the fifth embodiment of a display device 5 is introduced as follows. The display device 5 includes a display panel 52 and an integrated circuit 50, and compared to the first embodiment, the display panel 52 of the fifth embodiment further includes a plurality of testing switches 14 and a testing wire 15. The testing wire 15 is provided with a second predetermined voltage V2 to the inspected source line 11_1. For example, the integrated circuit 50 further includes an output terminal for outputting the second predetermined voltage V2 to one end of the testing wire 15 disposed on the display panel 52. In another embodiment, the second predetermined voltage V2 can be applied by a circuit on the display panel 52. Each testing switch 14 disposed on the display panel 52 is coupled between the other end of the testing wire 15 and the other end of one of the source lines 11_1~11_*k* far from the integrated circuit 50. The testing switch 14 disposed on the display panel 52 may be, but not limited to, a thin-film transistor (TFT). The other circuit architecture of the fifth embodiment is the same as that of the first embodiment so it will not be reiterated.

For illustrative purposes, take the multiplexer mux_1 as a first multiplexer, the multiplexer group MUX_1 as a first multiplexer group, and the AFE circuit AFE_1 as a first AFE circuit. When one end of the inspected source line 11_1 of the display panel 52 near the integrated circuit 50 coupled to the first multiplexer mux_1 of the first multiplexer group MUX_1 among the multiplexer groups MUX_1~MUX_n is connected to the inverting input terminal of the first AFE circuit AFE_1 corresponding to the first multiplexer group MUX_1 and provided with a fifth predetermined voltage V5, which is different from the second predetermined voltage V2, and the other end of the inspected source line 11_1 far from the integrated circuit 50 is provided with the second predetermined voltage V2, and the non-inspected source lines 11_2~11_*k* which are connected to other multiplexers mux_2~mux_k of the first multiplexer group are electrically connected to the second terminals T2 which are kept in a high impendence state Hi-Z, whether the inspected source line 11_1 is open-circuit is examined by the first AFE circuit AFE_1. In addition, the non-inverting input terminals of the AFE circuits AFE_2~AFE_n are coupled to the ground voltage GND. The testing switches 14 are electrically connected to the testing wire 15 and the source lines 11_2~11_*k* when the first AFE circuit examines whether any inspected source line is open-circuit. As illustrated in case E of FIG. 5, the first AFE circuit detects no current due to a closed loop that is formed when the inspected source line 11_1 is open-circuit. As illustrated in case F of FIG. 5, the first AFE circuit detects a current I so as to output a corresponding voltage due to a closed loop that is formed when the inspected source line 11_1 is not open-circuit. The AFE circuit AFE_1 can determine whether the display panel 52 is abnormal (i.e., source lines are open-circuit) and thus the display device 5 using the display panel 52 and the IC 50 is able to warn the user to reduce emergencies and increase safety.

In another embodiment of the invention, inspecting whether a source line corresponding to a multiplexer group MUX_i is inspected to be short-circuited to a gate line and inspecting whether a source line corresponding to a multiplexer group MUX_j (different form i) is inspected to be short-circuited to one another source line may be performed at the same time. i and j are positive integers. In such a case, the first terminals of other multiplexers of the multiplexer group MUX_j different from the multiplexer connected to the inspected source line regarding to source lines short-circuit test of the multiplexer group MUX_j are connected to the second terminals provided with GND.

Figure 6:
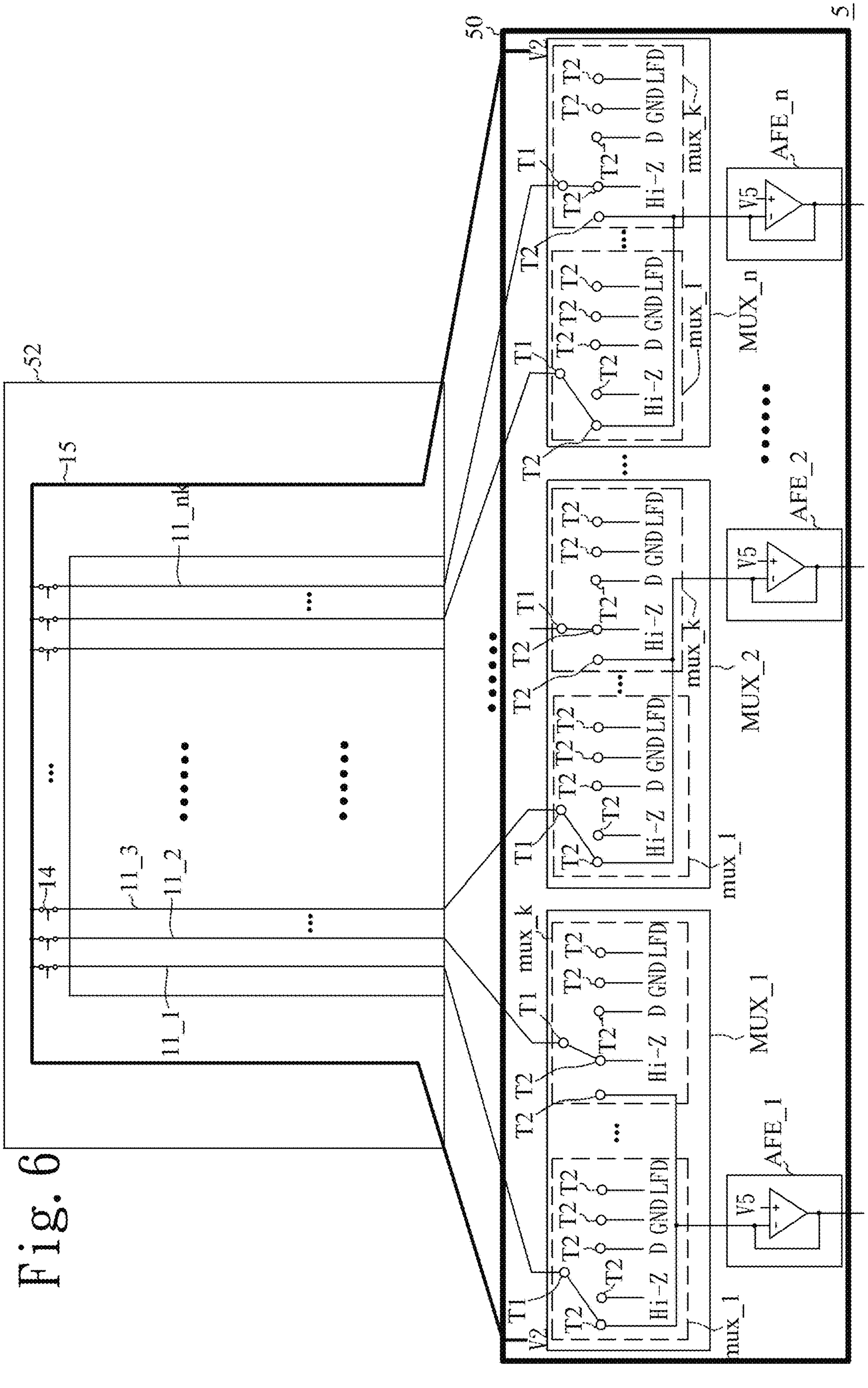
FIG. 6 is a diagram schematically illustrating a display device according to a sixth embodiment of the invention.

FIG. 6 is a diagram schematically illustrating a display device according to a sixth embodiment of the invention. Referring to FIG. 6, the sixth embodiment of the display device 5 is introduced as follows. The circuit architecture of the sixth embodiment is the same as that of the fifth embodiment so it will not be reiterated.

For illustrative purposes, take the multiplexer mux_1 as a first multiplexer. When one end of each inspected source line among the source lines 11_1~11_*k* of the display panel 52 near the integrated circuit 50 coupled to the first multiplexer of each of the multiplexer groups MUX_1~MUX_n is connected to the inverting input terminal of each AFE circuit AFE_1~AFE_n and provided with the first predetermined voltage V1 and the other end of each inspected source line far from the integrated circuit 50 is provided with the second predetermined voltage V2, and the non-inspected source lines which are connected to other multiplexers mux_2~mux_k of each of the multiplexer groups MUX_1~MUX_n are electrically connected to the second terminals T2 which are kept in a high impendence state Hi-Z, whether the inspected source lines are open-circuit is examined by the AFE circuits AFE_1~AFE_n at the same time. In addition, the non-inverting input terminals of the AFE circuits AFE_1~AFE_n are coupled to the fifth predetermined voltage V5. Specifically, each of the non-inspected source lines which are connected to the multiplexers mux_2~mux_k of each of the multiplexer groups MUX_1~MUX_n has one end near the integrated circuit 50 electrically connected to one of the second terminals T2 of each of the multiplexers mux_2~mux_k of each of the multiplexer groups MUX_1~MUX_n, which is kept in the high impendence state Hi-Z, and has the other end far from the integrated circuit 50 electrically connected to the testing wire 15 through the testing switch 14 disposed on the display panel 52. The testing switches 14 electrically connect the testing wire 15 and the inspected and non-inspected source lines 11_1~11_*k* when the AFE circuits AFE_1~AFE_n examine whether the inspected source lines are open-circuit. Each of the AFE circuits AFE_1~AFE_n detects no current due to closed loops that are not formed when the inspected source lines are open-circuit. Each of the AFE circuits AFE_1~AFE_n detects a current so as to output a corresponding voltage due to closed loops that are formed when the inspected source lines are not open-circuit. The AFE circuits AFE_1~AFE_n can determine whether the display panel 52 is abnormal (i.e., source lines are open-circuit) and thus the display device 5 using the display panel 52 and the IC 50 is able to warn the user to reduce emergencies and increase safety.

Figure 7:
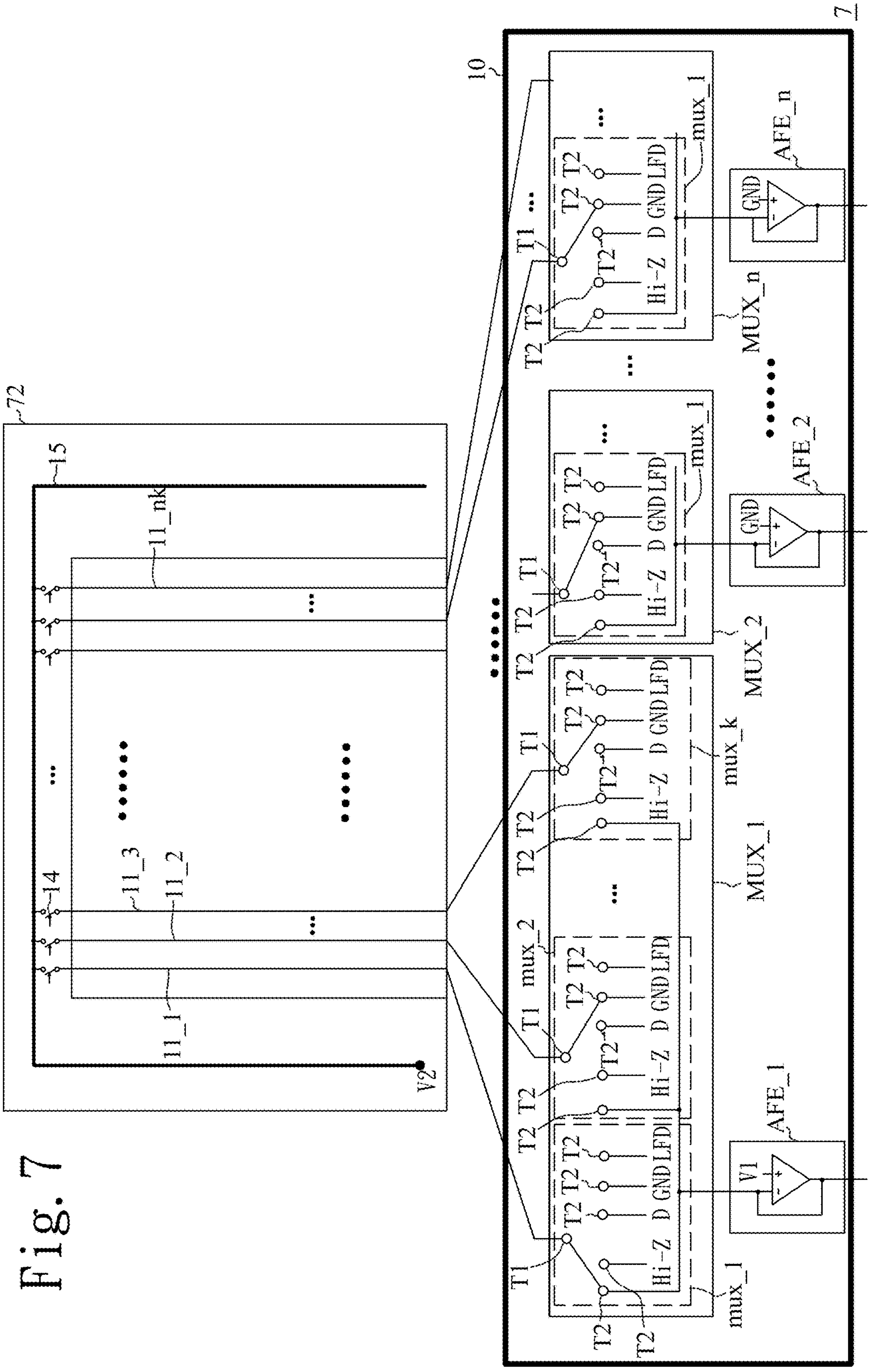
FIG. 7 is a diagram schematically illustrating a display device according to a seventh embodiment of the invention.

FIG. 7 is a diagram schematically illustrating a display device according to a seventh embodiment of the invention. Referring to FIG. 7, the seventh embodiment of a display device 7 is introduced as follows. The display device 7 includes a display panel 72 and the integrated circuit 10 as shown in FIG. 1 (or FIG. 2), and compared to the first embodiment, the display panel 72 of the seventh embodiment further includes a plurality of testing switches 14 and a testing wire 15. One end of the testing wire 15 is provided with a second predetermined voltage V2 to the inspected source line 11_1. For example, the second predetermined voltage V2 can be applied by a circuit on the display panel 72. Each testing switch 14 disposed on the display panel 72 is coupled between the other end of the testing wire 15 and the other end of one of the source lines 11_1~11_*k* far from the integrated circuit 10. The testing switch 14 disposed on the display panel 72 may be, but not limited to, a thin-film transistor (TFT). The other circuit architecture of the seventh embodiment is the same as that of the first embodiment so it will not be reiterated. The testing switches 14 electrically disconnect the testing wire 15 and the inspected and non-inspected source lines 11_1~11_*k* when the first AFE circuit examines whether the inspected source line 11_1 is short-circuited to another source line 11_2 . . . , or 11_*k*.

Figure 8:
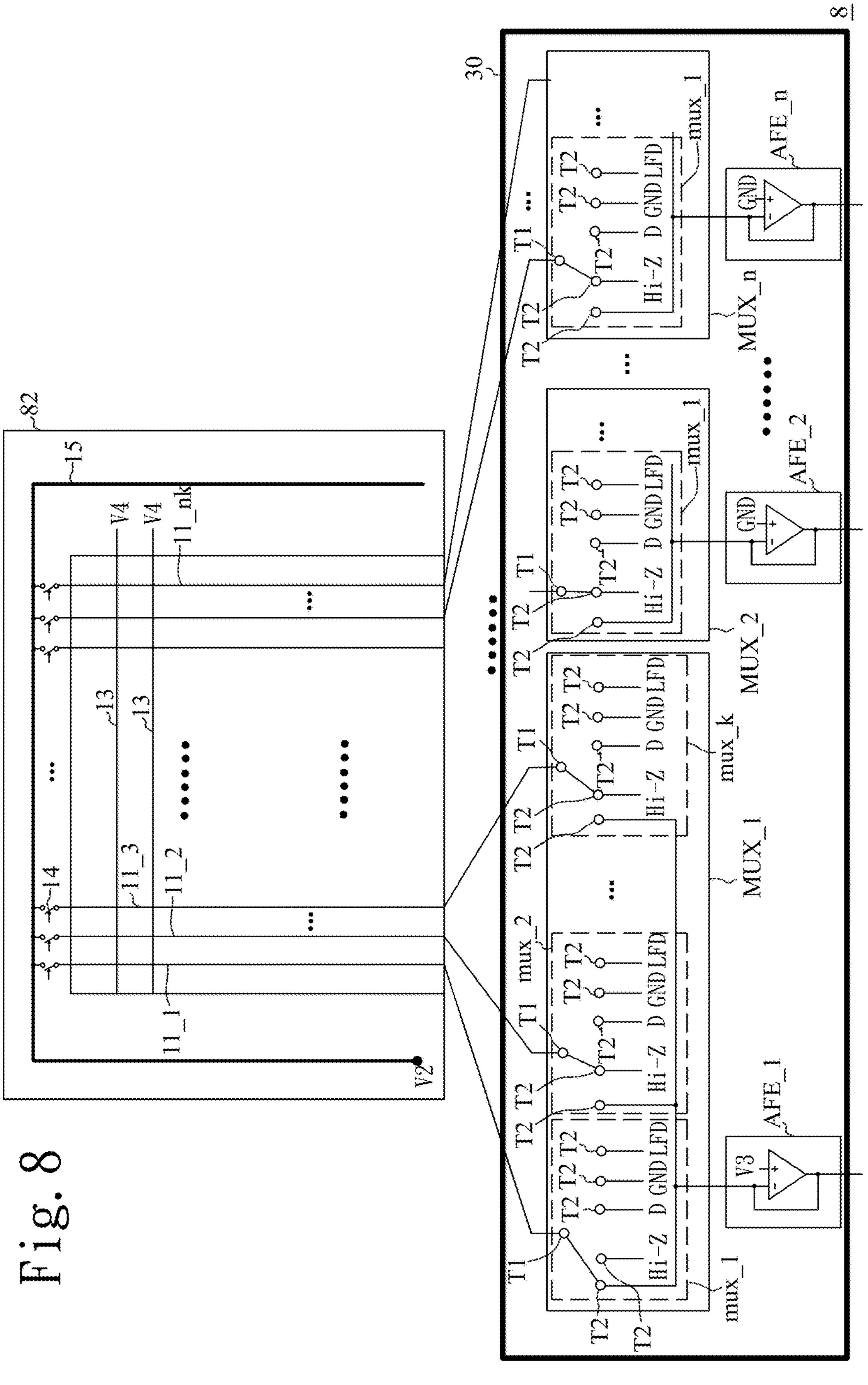
FIG. 8 is a diagram schematically illustrating a display device according to an eighth embodiment of the invention.

FIG. 8 is a diagram schematically illustrating a display panel according to an eighth embodiment of the invention. Referring to FIG. 8, the eighth embodiment of a display device 8 is introduced as follows. The display device 8 includes a display panel 82 and the integrated circuit 30 as shown in FIG. 3 (or FIG. 4), and compared to the third embodiment, the display panel 82 of the eighth embodiment further includes a plurality of testing switches 14 and a testing wire 15. One end of the testing wire 15 is provided with a second predetermined voltage V2 to the inspected source line 11_1. For example, the second predetermined voltage V2 can be applied by a circuit on the display panel 82. Each testing switch 14 disposed on the display panel 82 is coupled between the other end of the testing wire 15 and the other end of one of the source lines 11_1~11_*k* far from the integrated circuit 30. The testing switch 14 disposed on the display panel 82 may be, but not limited to, a thin-film transistor (TFT). The other circuit architecture of the eighth embodiment is the same as that of the third embodiment so it will not be reiterated. The testing switches 14 electrically disconnect the testing wire 15 and the inspected and non-inspected source lines 11_1~11_*k* when the first AFE circuit examines whether the inspected source line 11_1 is short-circuited to the gate line 13.

According to the embodiments provided above, the display panel and the integrated circuit use the AFE circuits to determine whether the display panel is abnormal and the display device is able to warn the user, thereby reducing emergencies and increasing safety.

The embodiments described above are only to exemplify the invention and not to limit the scope of the invention. Therefore, any equivalent modification or variation according to the shapes, structures, features, or spirit disclosed by the invention is to be also included within the scope of the invention.

What is claimed is:

1. An integrated circuit applicable to inspecting a display panel, comprising:

a plurality of analog front-end (AFE) circuits, each AFE circuit comprises a non-inverting input terminal coupled to a first predetermined voltage and an inverting input terminal; and a plurality of multiplexer groups, wherein each multiplexer group comprises a plurality of multiplexers, and each multiplexer is correspondingly configured in relation to one source line of the display panel and each multiplexer comprises a first terminal coupled to the source line of the display panel and a plurality of second terminals given by different settings, and the source line is configured correspondingly to one of the different settings by electrically connecting the first terminal and a selected second terminal from the plurality of second terminals, and wherein one of the plurality of second terminals is alternatively coupled to the inverting input terminal of one of the plurality of AFE circuits corresponding to one of the plurality of multiplexer groups;

wherein when one end of an inspected source line of the display panel near the integrated circuit coupled to a first multiplexer of a first multiplexer group among the plurality of multiplexer groups is connected to the inverting input terminal of a first AFE circuit corresponding to the first multiplexer group and provided with the first predetermined voltage and the other end of the inspected source line far from the integrated circuit is configured to be floating, and non-inspected source lines which are connected to multiplexers other than the first multiplexer are provided with another voltage different from the first predetermined voltage through the multiplexers other than the first multiplexer, whether the inspected source line is short-circuited to a non-inspected source line is examined by the first AFE circuit.

2. The integrated circuit applicable to inspecting a display panel according to claim 1, wherein the another voltage different from the first predetermined voltage is a ground voltage.

3. The integrated circuit applicable to inspecting a display panel according to claim 1, wherein the first AFE circuit detects a current when the inspected source line is short-circuited to the non-inspected source line.

4. The integrated circuit applicable to inspecting a display panel according to claim 1, wherein the first AFE circuit detects no current when the inspected source line is not short-circuited to the non-inspected source line.

5. A display device comprising:

an integrated circuit, comprising a plurality of analog front-end (AFE) circuits and a plurality of multiplexer groups; and a display panel, comprising:

source lines, each source line comprising one end near the integrated circuit and the other end far from the integrated circuit, wherein an inspected source line among the plurality of source lines is controlled to be electrically connected or disconnected to a first AFE circuit among the plurality of AFE circuits by a first multiplexer of a first multiplexer group of the plurality of multiplexer groups;

gate lines; a testing wire, being provided with a second predetermined voltage to the inspected source line; and a plurality of testing switches, wherein each testing switch is coupled between the testing wire and the other end of one of the plurality of source lines far from the integrated circuit and configured to perform at least one of the following actions:

electrically connect the testing wire and the inspected source line when the first AFE circuit examines whether the inspected source line is open-circuit; and electrically disconnect the testing wire and the inspected source line when the first AFE circuit examines whether the inspected source line is short-circuited to another source line; and electrically disconnect the testing wire and the inspected source line when the first AFE circuit examines whether the inspected source line is short-circuited to a gate line.

6. The display device according to claim 5, wherein each AFE circuit comprises a non-inverting input terminal coupled to a first predetermined voltage and an inverting input terminal.

7. The display device according to claim 6, wherein when one end of the inspected source line of the display panel near the integrated circuit coupled to the first multiplexer is connected to the inverting input terminal of the first AFE circuit corresponding to the first multiplexer group and provided with the first predetermined voltage and the other end of the inspected source line far from the integrated circuit is configured to be floating, and non-inspected source lines which are connected to multiplexers other than the first multiplexer are provided with another voltage different from the first predetermined voltage through the multiplexers other than the first multiplexer, whether the inspected source line is short-circuited to a non-inspected source line is examined by the first AFE circuit.

8. The display device according to claim 7, wherein the another voltage different from the first predetermined voltage is a ground voltage.

9. The display device according to claim 7, wherein the first AFE circuit detects a current when the inspected source line is short-circuited to the non-inspected source line.

10. The display device according to claim 7, wherein the first AFE circuit detects no current when the inspected source line is not short-circuited to the non-inspected source line.

11. The display device according to claim 6, wherein when one end of the inspected source line of the display panel near the integrated circuit coupled to the first multiplexer is connected to the inverting input terminal of the first AFE circuit corresponding to the first multiplexer group and provided with the first predetermined voltage and the other end of the inspected source line far from the integrated circuit is configured to be floating, and the gate lines of the display panel are provided with another voltage different from the first predetermined voltage, whether the inspected source line is short-circuited to one of the gate lines is examined by the first AFE circuit.

12. The display device according to claim 11, wherein the another voltage different from the first predetermined voltage is a ground voltage.

13. The display device according to claim 11, wherein the first AFE circuit detects a current when the inspected source line is short-circuited to the gate line.

14. The display device according to claim 11, wherein the first AFE circuit detects no current when the inspected source line is not short-circuited to the gate line.

15. The display device according to claim 11, wherein non-inspected source lines which are connected to multiplexers other than the first multiplexer are kept floating.

16. The display device according to claim 11, wherein non-inspected source lines which are connected to multiplexers other than the first multiplexer are respectively provided with a ground voltage.

17. The display device according to claim 6, wherein when one end of the inspected source line of the display panel near the integrated circuit coupled to the first multiplexer is connected to the inverting input terminal of the first AFE circuit corresponding to the first multiplexer group and provided with the first predetermined voltage and the other end of the inspected source line far from the integrated circuit is provided with the second predetermined voltage, and non-inspected source lines which are connected to multiplexers other than the first multiplexer are kept in a high impendence state, whether the inspected source line is open-circuit is examined by the first AFE circuit.

18. The display device according to claim 17, wherein the integrated circuit further comprises an output terminal for outputting the second predetermined voltage to the testing wire, wherein one end of the testing wire is connected to the output terminal outputting the second predetermined voltage.

19. The display device according to claim 18, wherein each of the non-inspected source lines which are connected to the multiplexers other than the first multiplexer has one end near the integrated circuit electrically connected to each of the multiplexers other than the first multiplexer, which is kept in the high impendence state, and has the other end far from the integrated circuit electrically connected to the testing wire through one of the plurality of testing switches.

20. The display device according to claim 17, wherein the first AFE circuit detects no current when the inspected source line is open-circuit.

21. The display device according to claim 17, wherein the first AFE circuit detects a current when the inspected source line is not open-circuit.

22. The display device according to claim 5, wherein the plurality of testing switches are thin-film transistors (TFTs).

23. The display device according to claim 5, wherein the plurality of AFE circuits are touch sensing AFE circuits.

24. An integrated circuit applicable to inspecting a display panel, comprising:

a plurality of analog front-end (AFE) circuits, each AFE circuit comprises a non-inverting input terminal coupled to a first predetermined voltage and an inverting input terminal; and a plurality of multiplexer groups, wherein each multiplexer group comprises a plurality of multiplexers, and each multiplexer is correspondingly configured in relation to one source line of the display panel and each multiplexer comprises a first terminal coupled to the source line of the display panel and a plurality of second terminals given by different settings, and the source line is configured correspondingly to one of the different settings by electrically connecting the first terminal and a selected second terminal from the plurality of second terminals, and wherein one of the plurality of second terminals is alternatively coupled to the inverting input terminal of one of the plurality of AFE circuits corresponding to one of the plurality of multiplexer groups;

wherein when one end of an inspected source line of the display panel near the integrated circuit coupled to a first multiplexer of a first multiplexer group among the plurality of multiplexer groups is connected to the inverting input terminal of a first AFE circuit corresponding to the first multiplexer group and provided with the first predetermined voltage and the other end of the inspected source line far from the integrated circuit is configured to be floating, and gate lines of the display panel are provided with another voltage different from the first predetermined voltage, whether the inspected source line is short-circuited to one of the gate lines is examined by the first AFE circuit.

25. The integrated circuit applicable to inspecting a display panel according to claim 24, wherein the another voltage different from the first predetermined voltage is a ground voltage.

26. The integrated circuit applicable to inspecting a display panel according to claim 24, wherein the first AFE circuit detects a current when the inspected source line is short-circuited to the gate line.

27. The integrated circuit applicable to inspecting a display panel according to claim 24, wherein the first AFE circuit detects no current when the inspected source line is not short-circuited to the gate line.

28. The integrated circuit applicable to inspecting a display panel according to claim 24, wherein non-inspected source lines which are connected to multiplexers other than the first multiplexer are kept floating.

29. The integrated circuit applicable to inspecting a display panel according to claim 24, wherein non-inspected source lines which are connected to multiplexers other than the first multiplexer are respectively provided with a ground voltage.

30. An integrated circuit applicable to inspecting a display panel, comprising:

a plurality of analog front-end (AFE) circuits, each AFE circuit comprises a non-inverting input terminal coupled to a first predetermined voltage and an inverting input terminal; and a plurality of multiplexer groups, wherein each multiplexer group comprises a plurality of multiplexers, and each multiplexer is correspondingly configured in relation to one source line of the display panel and each multiplexer comprises a first terminal coupled to the source line of the display panel and a plurality of second terminals given by different settings, and the source line is configured correspondingly to one of the different settings by electrically connecting the first terminal and a selected second terminal from the plurality of second terminals, and wherein one of the plurality of second terminals is alternatively coupled to the inverting input terminal of one of the plurality of AFE circuits corresponding to one of the plurality of multiplexer groups;

wherein when one end of an inspected source line of the display panel near the integrated circuit coupled to a first multiplexer of a first multiplexer group among the plurality of multiplexer groups is connected to the inverting input terminal of the first AFE circuit corresponding to the first multiplexer group and provided with the first predetermined voltage and the other end of the inspected source line far from the integrated circuit is provided with a second predetermined voltage, and non-inspected source lines which are connected to multiplexers other than the first multiplexer are electrically connected to the plurality of second terminals which are kept in a high impendence state, whether the inspected source line is open-circuit is examined by the first AFE circuit.

31. The integrated circuit applicable to inspecting a display panel according to claim 30, further comprising an output terminal for outputting the second predetermined voltage to a testing wire disposed on the display panel, wherein one end of the testing wire is connected to the output terminal outputting the second predetermined voltage and the other end of the testing wire is electrically coupled to the other end of the inspected source line far from the integrated circuit through a testing switch disposed on the display panel.

32. The integrated circuit applicable to inspecting a display panel according to claim 31, wherein each of the non-inspected source lines which are connected to the multiplexers other than the first multiplexer has one end near the integrated circuit electrically connected to one of the plurality of second terminals of each of the multiplexers other than the first multiplexer, which is kept in the high impendence state, and has the other end far from the integrated circuit electrically connected to the testing wire through another testing switch disposed on the display panel.

33. The integrated circuit applicable to inspecting a display panel according to claim 32, wherein the testing switch disposed on the display panel is a thin-film transistor (TFT).

34. The integrated circuit applicable to inspecting a display panel according to claim 32, wherein the AFE circuits are touch sensing AFE circuits.

35. The integrated detection circuit structure applicable to inspecting a display panel according to claim 30, wherein the first AFE circuit detects no current when the inspected source line is open-circuit.

36. The integrated detection circuit structure applicable to inspecting a display panel according to claim 30, wherein the first AFE circuit detects a current when the inspected source line is not open-circuit.

* * * * *